(12) United States Patent
Sawada et al.

(10) Patent No.: US 7,919,357 B2
(45) Date of Patent: Apr. 5, 2011

(54) METHOD FOR MUTUALLY CONNECTING SUBSTRATES, FLIP CHIP MOUNTING BODY, AND MUTUAL CONNECTION STRUCTURE BETWEEN SUBSTRATES

(75) Inventors: Susumu Sawada, Osaka (JP); Seiichi Nakatani, Osaka (JP); Seiji Karashima, Osaka (JP); Takashi Kitae, Osaka (JP)

(73) Assignee: Panasonic Corporation, Osaka (JP)

( * ) Notice: Subject to any disclaimer, the term of this patent is extended or adjusted under 35 U.S.C. 154(b) by 164 days.

(21) Appl. No.: 12/489,895

(22) Filed: Jun. 23, 2009

(65) Prior Publication Data
US 2010/0001411 A1 Jan. 7, 2010

(30) Foreign Application Priority Data
Jul. 2, 2008 (JP) ................ 2008-173674

(51) Int. Cl.
*H01L 21/00* (2006.01)
(52) U.S. Cl. . 438/108; 438/455; 257/778; 257/E21.503; 257/E21.511
(58) Field of Classification Search ............... 438/108, 438/455; 257/778, E21.503, E21.511
See application file for complete search history.

(56) References Cited

U.S. PATENT DOCUMENTS
6,881,607 B2 * 4/2005 Farnworth .............. 438/106
2002/0185309 A1 * 12/2002 Imamura et al. ............ 174/261
2008/0284046 A1 11/2008 Karashima et al.

FOREIGN PATENT DOCUMENTS
WO WO 2006/103948 A1 10/2006
* cited by examiner

*Primary Examiner* — Khiem D Nguyen
(74) *Attorney, Agent, or Firm* — McDermott Will & Emery LLP

(57) ABSTRACT

A resin containing conductive particles and a gas bubble generating agent is supplied between a first substrate and a second substrate, and then the resin is heated to generate gas bubbles from the gas bubble generating agent contained in the resin so that the resin is self-assembled between electrodes. Then, the resin is further heated to melt the conductive particles contained in the resin, thereby forming connectors between electrodes. A partition member sealing the gap between the substrates is provided near a peripheral portion of the resin, and gas bubbles in the resin are discharged to the outside through the peripheral portion of the resin where the partition member is absent.

12 Claims, 11 Drawing Sheets

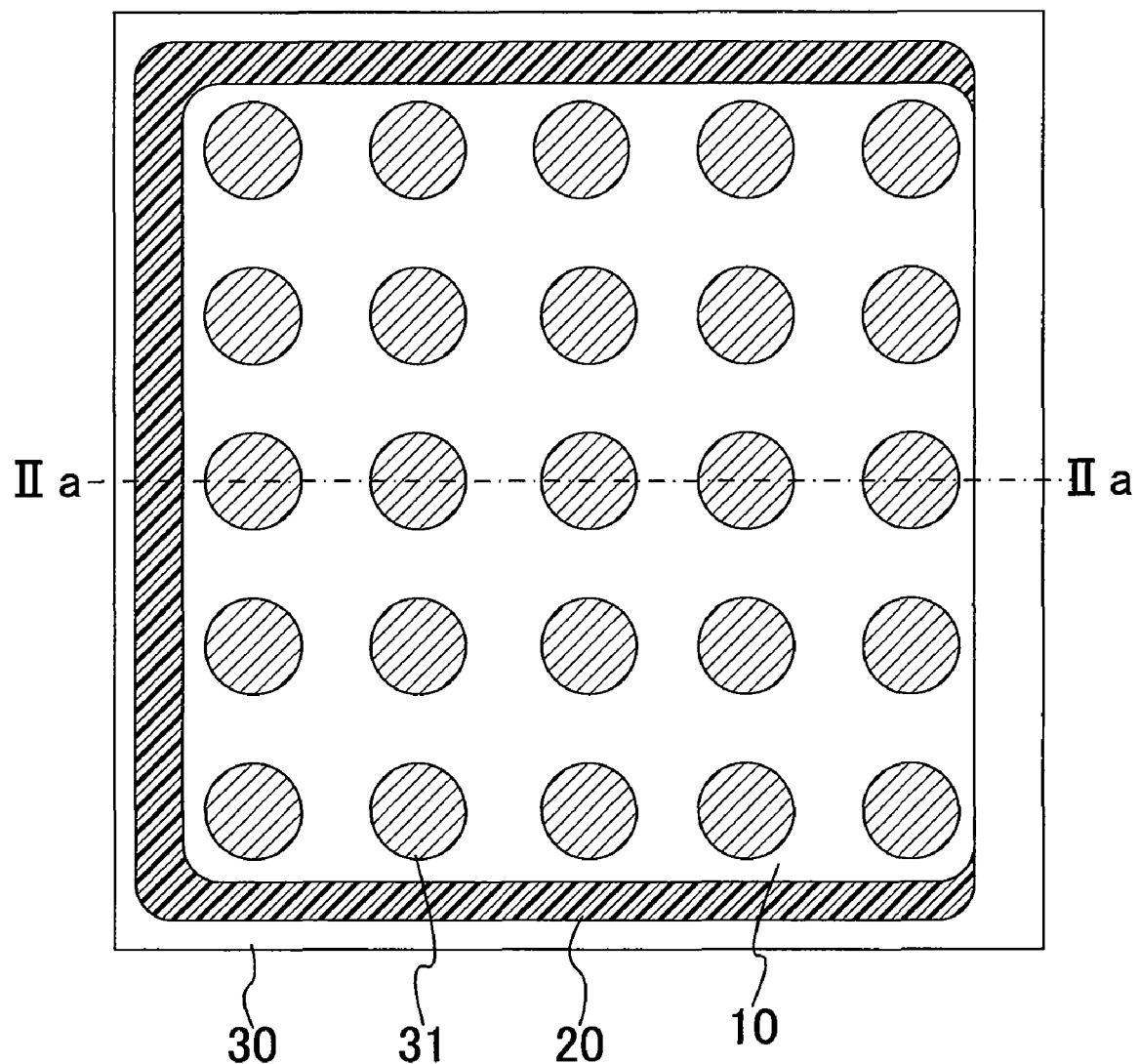

PRIOR ART

METHOD FOR MUTUALLY CONNECTING SUBSTRATES, FLIP CHIP MOUNTING BODY, AND MUTUAL CONNECTION STRUCTURE BETWEEN SUBSTRATES

CROSS REFERENCE TO RELATED APPLICATIONS

This application claims priority from Japanese application JP2008-173674 filed on Jul. 2, 2008, the disclosure of which application is hereby incorporated by reference into this application in its entirety for all purposes.

BACKGROUND

The present disclosure relates to a method for mutually connecting substrates having a plurality of electrodes formed thereon, and a flip chip mounting body and a mutual connection structure between substrates formed by using the same.

In recent years, along with an increase in the density of semiconductor integrated circuits (LSIs), circuit substrates and electronic components used in electronic equipment, the pin count of the electrodes is increasing and the pitch thereof is decreasing rapidly. With methods for mounting these electronic components, there are demands for accommodating narrower pitches, realizing shorter tact times, enabling a single-step formation of connectors, etc.

With these demands, some inventors of the present application have proposed, in WO 2006/103948 A1 (US 2008/0284046 A1), a flip chip mounting method, which uses a resin containing conductive particles and a gas bubble generating agent, as a next-generation mounting method.

FIGS. 11A to 11D are cross-sectional views showing basic steps of the flip chip mounting method disclosed in the above-mentioned document.

As shown in FIG. 11A, a resin 11D containing conductive particles 111 and a gas bubble generating agent (not shown) is supplied onto a circuit substrate 130 having a plurality of connection terminals 131 thereon. Then, as shown in FIG. 11B, a semiconductor chip 132 having a plurality of electrode terminals 133 thereon is placed so as to face the circuit substrate 130. Then, as shown in FIG. 11C, the resin 110 is heated so as to generate gas bubbles 114 from the gas bubble generating agent in the resin 110. In this process, the resin 110 is pushed by the growing gas bubbles 114 toward the outside of the gas bubbles 114, whereby the resin 110 is self-assembled between the connection terminals 131 and the electrode terminals 133. Then, as shown in FIG. 11D, the resin 110 is further heated so as to melt the conductive particles 111 in the resin 110, which have been self-assembled between the connection terminals 131 and the electrode terminals 133 (hereinafter referred to simply as "between terminals"), thereby forming connectors 113 between terminals. Thus, there is obtained a flip chip mounting body in which terminals are electrically connected together via the connectors 113 therebetween. Note that this method can also be applied to, for example, the connection between substrates having electronic components mounted thereon.

SUMMARY

With the method described above, a driving force for moving the resin 110 between terminals is given by the growth of the gas bubbles 114, which are generated from the gas bubble generating agent. Therefore, the method is suitable for connections between terminals arranged at a narrow pitch. The resin 110, which has been guided between terminals, can stably stay between terminals due to the surface tension, and the conductive particles 111 in the resin 110, which have been self-assembled between terminals, can melt and thereby wet-spread between terminals. Therefore, it is possible to stably form the connectors 113 between terminals.

In the method described above, the gas bubbles 114 generated in the resin 110 are preferably discharged to the outside through the side edge portions of the circuit substrate 130 and the semiconductor chip 132 (hereinafter referred to simply as "substrates") (the peripheral portion of the resin 110), after the resin 110 is self-assembled between terminals. However, the gas bubbles 114 may be left in areas between substrates outside the spaces between terminals. In such a case, for example, when the flip chip mounting body is further mounted on another circuit substrate, or the like, moisture, which has accumulated in the gas bubbles 114, may cause steam explosion, or the like, by the re-heating, thus resulting in a connection failure.

The present invention has been made in view of the above, and a primary object thereof is to provide a method for electrically connecting substrates together by self-assembling a resin between terminals by the growth of gas bubbles generated in the resin, and then melting the conductive particles in the resin to form connectors between terminals, wherein the gas bubbles generated in the resin can be controllably moved to the side edge portion of the substrate (the peripheral portion of the resin) and effectively discharged to the outside, thus realizing a mounting body having a high reliability.

This Summary is provided to introduce a selection of concepts in a simplified form that are further described below in the Detailed Description. It is not intended to identify key features of the claimed subject matter, nor is it intended to be used as an aid in determining the scope of the claimed subject matter.

The invention disclosed and claimed herein, in one aspect thereof, is a method for mutually connecting substrates, in which facing a first substrate having a plurality of first electrodes thereon, a second substrate having a plurality of second electrodes thereon is placed, and the first electrodes and the second electrodes are electrically connected to each other via connectors therebetween, the method including the steps of: (a) supplying a resin containing conductive particles and a gas bubble generating agent to an area between the first substrate and the second substrate which at least covers the plurality of first electrodes and second electrodes; (b) heating the resin to thereby generate gas bubbles from the gas bubble generating agent contained in the resin; and (c) heating the resin to thereby melt the conductive particles contained in the resin, wherein in the step (a), a partition member sealing a gap between the first substrate and the second substrate is provided near a peripheral portion of the resin, and a peripheral portion of the resin where the partition member is absent is open to an outside, in the step (b), the resin is pushed out toward an outside of the gas bubbles generated from the gas bubble generating agent by growth of the gas bubbles, thereby being guided into spaces between the first electrodes and the second electrodes, and the gas bubbles are discharged to the outside through the peripheral portion of the resin which is open to the outside, and in the step (c), the conductive particles contained in the resin, which have been guided into the spaces between the electrodes, are melted to thereby form the connectors between the electrodes.

According to the method above, the gas bubbles generated in the resin are discharged to the outside by being guided toward the peripheral portion of the resin which is open to the outside due to the difference between the pressure of the resin in the closed space near the partition member and the pressure on the open side (the atmospheric pressure). Thus, it is possible to prevent gas bubbles from being left between substrates, and it is therefore possible to realize a mounting body with high reliability.

In a preferred embodiment, the partition member is provided adjacent to the peripheral portion of the resin.

In a preferred embodiment, the plurality of first electrodes and the plurality of second electrodes are arranged in an array pattern on the first substrate and on the second substrate, respectively, and the partition member is provided along at least one side of the array-pattern electrode arrangement.

In a preferred embodiment, the plurality of first electrodes and the plurality of second electrodes are arranged along a periphery of the first substrate and the second substrate, respectively, and the partition member is provided inside the electrode arrangement along the substrate periphery.

In a preferred embodiment, the plurality of first electrodes and the plurality of second electrodes are arranged parallel to one another in a linear pattern, and the partition member is provided so as to extend in a direction perpendicular to the electrodes arranged in the linear pattern. Alternatively, the partition member may be provided so as to extend in a direction parallel to the electrodes arranged in the linear pattern along a periphery of the linear-pattern electrode arrangement.

In a preferred embodiment, the method further includes a step of removing the partition member, after the step (b) or the step (c).

In a preferred embodiment, at least one of the first substrate and the second substrate is provided with a gas bubble generating source for generating gas bubbles, instead of providing the gas bubble generating agent contained in the resin, and in the step (b), the gas bubbles are generated from the gas bubble generating source.

In a preferred embodiment, the first substrate and the second substrate are each a circuit substrate or a semiconductor chip.

A flip chip mounting body of the present invention is a flip chip mounting body, including a circuit substrate and a semiconductor chip mounted on the circuit substrate, wherein electrodes formed on the circuit substrate and the semiconductor chip are electrically connected to each other via connectors therebetween by the above method for mutually connecting substrates of the present invention.

A mutual connection structure between substrates of the present invention is a mutual connection structure between substrates, in which circuit substrates having a plurality of electrodes thereon are electrically connected to each other, wherein the circuit substrates are electrically connected to each other via connectors formed between the electrodes by the above method for mutually connecting substrates of the present invention.

According to the present invention, the partition member, which seals the gap between substrates, is provided near the peripheral portion of the resin, whereby the gas bubbles generated in the resin can be effectively discharged to the outside through the peripheral portion of the resin where the partition member is absent, and it is thus possible to realize a reliable mutual connection between substrates with no gas bubbles left between substrates.

In addition, in the process of moving the gas bubbles generated in the resin toward the peripheral portion of the resin that is open to the outside, the residue of conductive particles left in areas other than between electrodes is scraped off of the passageway of the gas bubbles and into spaces between opposing electrodes. Thus, it is possible to reduce the residue of the conductive particles. Therefore, it is possible to realize a mutual connection between substrates having excellent insulation with no residue of conductive particles.

BRIEF DESCRIPTION OF THE DRAWINGS

FIG. 3 is a plan view showing the method for mutually connecting substrates according to the first embodiment.

DETAILED DESCRIPTION

A method for mutually connecting substrates of the present invention shares basic steps with the method shown in FIGS. 11A to 11E.

This method is characterized in that a resin, which has been supplied into a gap between a circuit substrate (first substrate) and a semiconductor chip (second substrate), is heated to thereby generate gas bubbles from a gas bubble generating agent, and the resin is pushed toward the outside of the gas bubbles by the expansion of the gas bubbles so that the resin is self-assembled between electrodes.

Herein, the mechanism of the phenomenon in which the resin is self-assembled between electrodes will now be described with reference to FIGS. 1A and 1B.

Figure 1A:
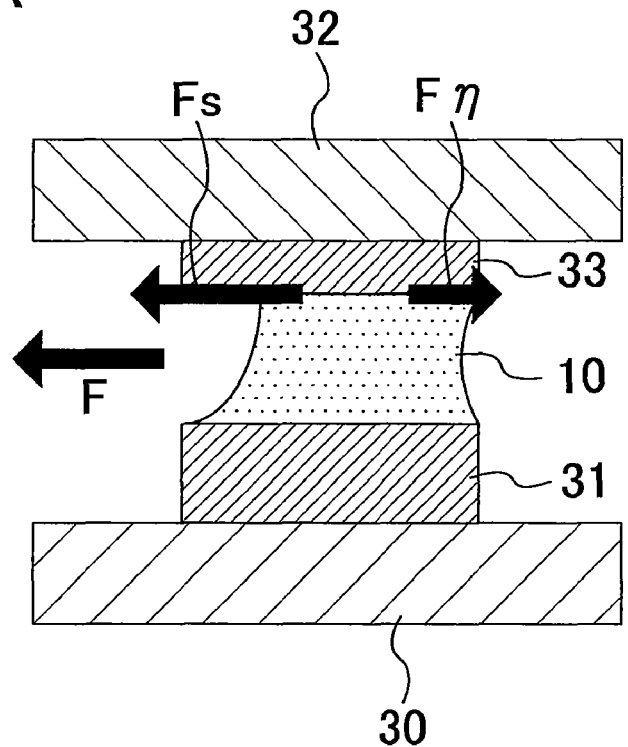
FIGS. 1A and 1B are cross-sectional views showing the mechanism of the phenomenon in which a resin is self-assembled between electrodes according to the present invention.

FIG. 1A is a cross-sectional view showing a state where a resin 10 has been pushed out by an expanded gas bubble (not shown) into the gap between a first electrode 31 of a first substrate 30 and a second electrode 33 of a second substrate 32. The resin 10, which is in contact with the first electrode 31 and the second electrode 33, has an interfacial tension Fs (a force generated by the so-called "wet-spread" of the resin) at the interface that is greater than the stress Fη resulting from the viscosity η of the resin. Therefore, the resin 10 spreads entirely across the first electrode 31 and the second electrode 33, eventually forming the columnar resin 10 whose boundary lies at the edge portion of the first electrode 31 and the second electrode 33. Thus, even if the positions of the first electrode 31 and the second electrode 33 facing each other are slightly shifted from each other, the resin 10 can reliably be self-assembled by the interfacial tension between the first electrode 31 and the second electrode 33 (hereinafter referred to simply as "between electrodes").

Figure 1B:
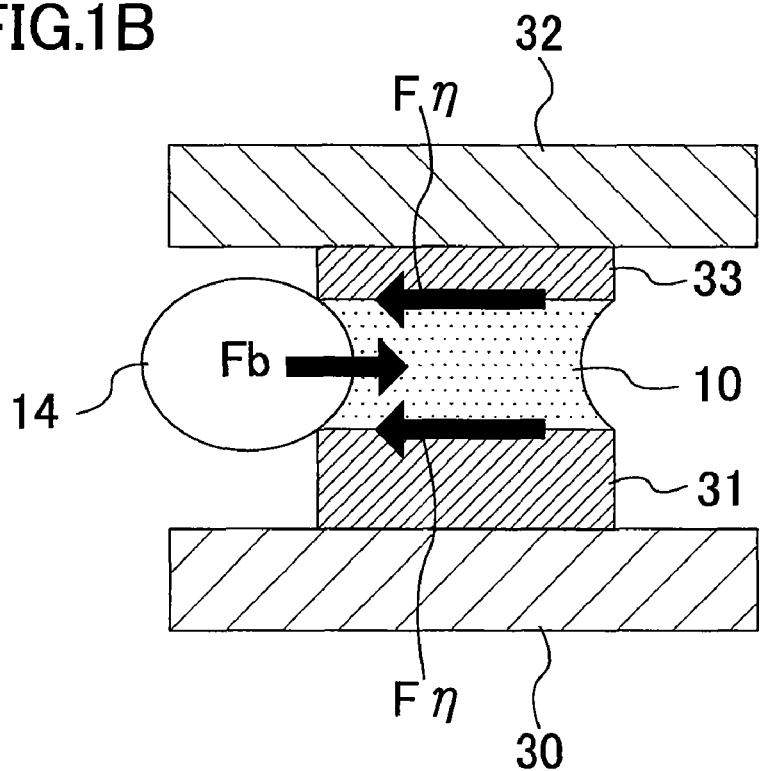

Note that although the columnar resin 10 formed by self-assembly between electrodes receives the stress Fb resulting from the growth (or movement) of a gas bubble 14 as shown in FIG. 1B, the columnar resin 10 can maintain its shape by the effect of the stress Fη from the viscosity η of the resin 10, and the resin 10, once self-assembled, will not disappear. Moreover, there is a surface tension (or a gas-liquid interfacial tension) at the boundary between the resin 10 and a gas (e.g., the gas bubble 14), and this surface tension can also serve to maintain the shape of the columnar resin.

Herein, whether the self-assembled resin 10 can maintain a constant shape is also dependent on the area S of the electrodes 31 and 33, the distance L therebetween, and the viscosity η of the resin 10, as well as on the interfacial tension Fs as described above. It is believed that the following relationship holds qualitatively where T denotes the index of how the resin 10 can remain in a constant shape.

$$T = K \cdot (S/L) \cdot \eta \cdot Fs \text{ (where } K \text{ is a constant)}$$

As described above, the present method is to form the resin 10 between electrodes in a self-aligned manner by utilizing the self-assembly of the resin 10 by the interfacial tension. It can be said that the self-assembly by the interfacial tension utilizes a phenomenon occurring in the space between electrodes, which is more constricted than other areas of the gap between substrates due to the protruding shape employed by at least one of the first electrode 31 and the second electrode 33 formed on the surface of the first substrate 30 and the second substrate 32, respectively.

With the above method proposed by the present applicant, conductive particles dispersed in the resin 10 can be efficiently self-assembled between electrodes, thereby realizing a mutual connection between substrates with excellent uniformity and high productivity.

Preferred embodiments will now be described with reference to the drawings. For the sake of simplicity, like elements are denoted by like reference numerals throughout the various figures. Note that the present invention is not limited to these embodiments shown below.

First Embodiment

Figure 2A:
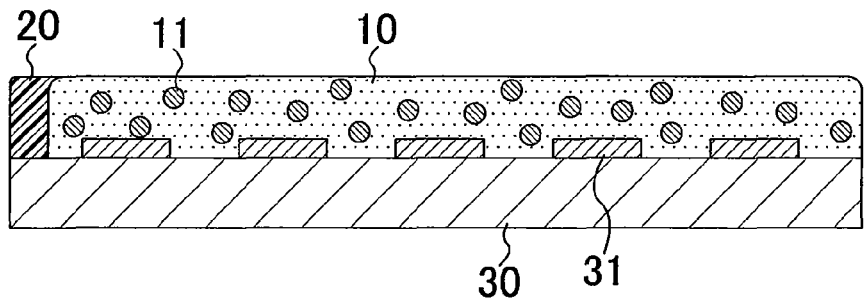
FIGS. 2A to 2D are cross-sectional views showing a method for mutually connecting substrates according to a first embodiment.

FIGS. 2A to 2D are cross-sectional views showing steps of a method for mutually connecting substrates according to a first embodiment, and FIG. 3 is a plan view showing the step of FIG. 2A. Note that the cross-sectional views of FIGS. 2A to 2D are each taken along broken line IIa-IIa in FIG. 3.

First, as shown in FIG. 2A, the resin 10 containing conductive particles (e.g., solder powder) 11 is supplied onto the first substrate 30 having the first electrodes 31 thereon. At this point, there is a partition member 20 that seals the gap between the first substrate 30 and the second substrate 32 near the peripheral portion of the resin 10. For example, as shown in FIG. 3, the partition member 20 is provided so as to surround three sides of the peripheral portion of the resin 10, with the peripheral portion of the resin 10 where the partition member 20 is absent being open to the outside. Herein, while the partition member 20 is provided adjacent to the peripheral portion of the resin 10 in FIG. 3, the partition member 20 may be spaced apart from the peripheral portion of the resin 10 as long as the gap between the substrates 30 and 32 is sealed. Note that methods of arrangement of the partition member 20 will be described later.

Figure 2B:
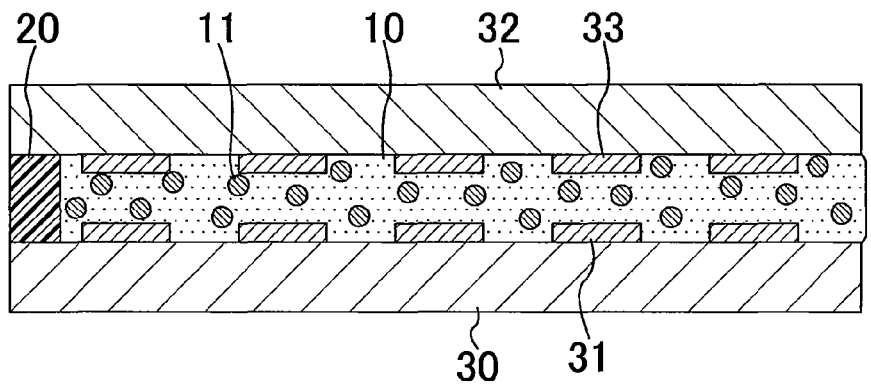

Then, as shown in FIG. 2B, the second substrate 32 having the second electrodes 33 thereon is placed on the surface of the resin 10 so that the substrates face each other.

Figure 2C:
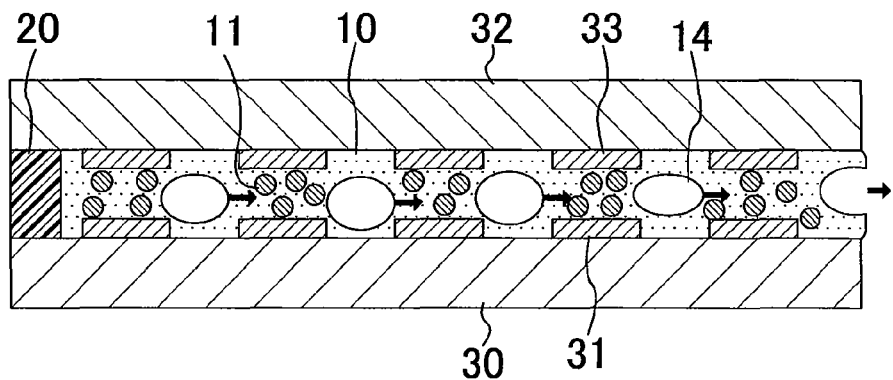

In this state, the resin 10 is heated, whereby the gas bubbles 14 are generated from the gas bubble generating agent (not shown) in the resin 10 as shown in FIG. 2C, and the resin 10 is pushed toward the outside of the gas bubbles 14 by the expansion of the generated gas bubbles 14. The resin 10 pushed out is self-assembled in a columnar shape between electrodes.

Figure 2D:
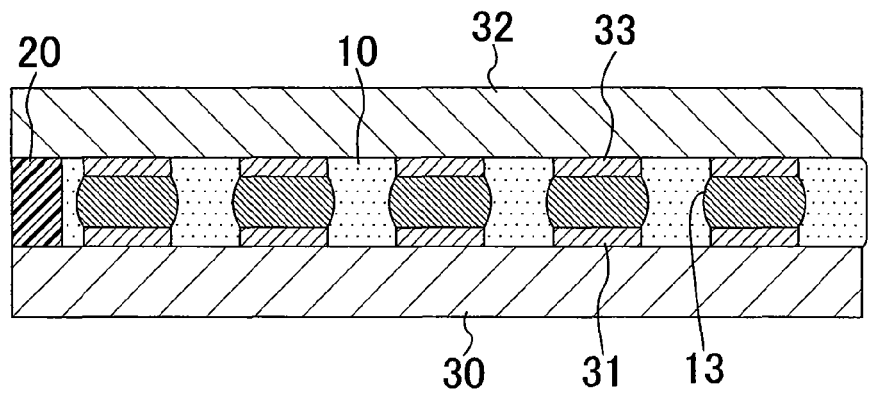

Then, as shown in FIG. 2D, when the resin 10 is heated again, the conductive particles 11, which have been guided between electrodes, are melted, thereby forming connectors 13 made of molten conductive particles between electrodes having high wettability for the conductive particles 11. Thus, it is possible to realize a state where the first electrodes 31 and the second electrodes 33 are electrically connected together via the connectors 13 therebetween, with the gap between the first substrate 30 and the second substrate 32 being filled with the resin 10.

In the method described above, since the partition member 20, which seals the gap between the first substrate 30 and the second substrate 32, is provided near the peripheral portion of the resin 10, the expansion of the generated gas bubbles 14 increases the pressure of the resin present in the closed space on the side sealed by the partition member 20. As a result, due to the difference between the pressure on the side of the partition member 20 and that on the open side, the generated gas bubbles 14 move, while forming a flow, from the side of the partition member 20 toward the peripheral portion of the resin 10 that is open to the outside. In this process, the gas bubbles 14, which move while expanding and growing, pass through areas between adjacent electrodes. Therefore, the resin 10 containing the conductive particles 11, which is left in the areas outside the spaces between electrodes, is self-assembled while being pushed out into the spaces between opposing electrodes, and the moving gas bubbles 14 are discharged to the outside through the peripheral portion of the resin 10 that is open to the outside.

That is, the moving gas bubbles 14 form a flow that guides the gas bubbles 14 from the side of the partition member 20 toward the open side, thereby controlling the direction of movement of the gas bubbles 14 generated in the resin 10. Therefore, it is possible to effectively discharge the gas bubbles 14 generated in the resin 10 out of the area surrounded by the partition member 20, and to remove gas bubbles left between the first substrate 30 and the second substrate 32.

During the process in which the gas bubbles 14 move from the side of the partition member 20 toward the open side, the residue of the conductive particles 11 left between adjacent electrodes is scraped off of the passageway of the gas bubbles 14 and into spaces between electrodes. Thus, it is possible to reduce the residue of the conductive particles 11.

Therefore, it is possible to reduce the residue of the conductive particles 11, which may cause electrical shorting, and to reduce the residue of gas bubbles (voids), which may cause a defect such as ion migration due to moisture absorption or may cause peel-off of electrodes during the re-heating in a subsequent step. As a result, it is possible to realize a reliable mutual connection between substrates having excellent uniformity and ensuring high insulation and high adhesion strength.

Herein, after the connectors 13 are formed between electrodes, the resin 10 left between the substrates 30 and 32 may then be cured, thereby fixing together the first substrate 30 and the second substrate 32.

Thus, it is possible to ensure reliable mechanical holding between the first substrate 30 and the second substrate 32, and to increase the insulation reliability between adjacent electrodes. In addition, it is possible to simultaneously achieve the electrical connection between electrodes and the fixing between the substrates 30 and 32 in a continuous series of steps, without requiring a step of injecting an underfill material between the semiconductor chip and the circuit board so as to fix the semiconductor chip to the circuit board after mounting the semiconductor chip on the circuit board as in a flip chip mounting process, for example.

Note that the partition member 20 is provided for the purpose of effectively discharging the gas bubbles 14 generated in the resin 10 to the outside, and the partition member 20 may be removed after the resin 10 is self-assembled between electrodes or after the connectors 13 made of molten conductive particles are formed between electrodes.

Herein, the size of each of the components or the positional relationship therebetween (e.g., the size of the conductive particles 11, the distance between the first substrate 30 and the second substrate 32, etc.) shown in FIGS. 2A to 2D and 3 are merely shown for the purpose of illustration, and are not representative of the actual size, etc.

While FIG. 2D shows a state where the conductive particles 11 of the connectors 13 have been all melted and solidified, such a state is not always necessary. For example, the present invention also accommodates a state where some of the conductive particles 11 have not been melted, and a state where only the surface of the conductive particles 11 has been melted and solidified, wherein metallic bond is made between the conductive particles 11 or at the interface between the conductive particles 11 and the surface of the first electrode 31 or the second electrode 33.

While the connectors 13 are formed between all electrodes of the first electrode 31 and all electrodes of the second electrode 33 in FIGS. 2A to 2D, the connectors 13 may be formed between only some of the electrodes on the substrates.

Herein, the materials of the resin 10, the conductive particles 11, the gas bubble generating agent and the partition member 20 used in the example embodiments may be as shown below, though they are not limited to any particular materials.

The resin 10 may be any resin having such a viscosity that the resin 10 can flow in the range between room temperature and the melting point of the conductive particles 11, and may also be a resin whose viscosity decreases to such a viscosity that the resin 10 can flow when the resin 10 is heated. A typical example may be a thermosetting resin such as an epoxy resin, a phenol resin, a silicone resin, a diallyl phthalate resin, a furan resin, or a melamine resin, a thermoplastic resin such as a polyester elastomer, a fluorocarbon resin, a polyimide resin, a polyamide resin, or an aramid resin, a photosensitive (UV-curable) resin, or a combination thereof. Note that a high boiling solvent, an oil, etc., may also be used instead of a resin. Gas bubbles may be generated in the resin 10 by boiling and decomposing the resin 10 when the resin 10 is heated, instead of providing a gas bubble generating agent contained in the resin 10. Alternatively, at least one of the first substrate 30 and the second substrate 32 may be provided with a gas bubble generating source for generating gas bubbles.

The conductive particles 11 contain at least one of metal particles, solder particles, solder- or metal-plated metal particles, and solder- or metal-plated resin particles, and may be, for example, a solder alloy such as an Sn—Bi alloy or an Sn—Ag alloy, or a metal such as Cu, Ag or AgCu. In the present invention, the electrical connection between electrodes is made by melting conductive particles, and it is therefore preferred that the growth of an oxide film on the surface of the conductive particles is prevented as much as possible. Alternatively, only the surfaces of conductive particles in contact with each other are melted so that metallic bond is made at the interface therebetween.

The gas bubble generating agent may be any material that generates gas bubbles as it boils when heated. A typical example may be a low boiling material such as hexane, vinyl acetate, isopropyl alcohol, water, 1,4-dioxane, or butyl acetate, or a material having a relatively high boiling point such as dimethylamine hydrochloride, dimethyl sulfoxide, ethylene glycol, α-terpineol, butyl carbitol, or butyl carbitol acetate.

Note that regarding the melting of the conductive particles 11 in the resin 10 having been self-assembled between electrodes, the conductive particles 11 may be partly melted at the point when they are assembled between electrodes, or the melting may be started at the point when the assembly between electrodes is completed. The time at which melting of the conductive particles 11 starts, the time at which the generation of the gas bubbles 14 starts, and the period in which the gas bubbles 14 move in the bubble-releasing direction and are discharged through the peripheral portion of the resin 10 can be set by appropriately selecting the combination of the melting point of the conductive particles 11 used, the viscosity of the resin 10 used and the boiling point of the gas bubble generating agent used, and the temperature profile for the heating process.

The partition member 20 on the first substrate 30 can be formed by any of various methods. For example, the partition member 20 can be formed by applying a resin at a predetermined position. In such a case, the resin of the partition member 20 may be of the same composition as that of the resin 10. However, since the partition member 20 is provided for the purpose of sealing the gap between the first substrate 30 and the second substrate 32, the partition member 20 is preferably made of a resin that does not contain the conductive particles 11 or the gas bubble generating agent so that the conductive particles 11 do not melt and the gas bubbles 14 are not generated during the heating step, unlike the resin 10.

Moreover, the partition member 20 is preferably made of a resin that has a higher viscosity than the resin 10 at least during the step of heating the resin 10 so as to better seal the gap between the first substrate 30 and the second substrate 32. In a case where a curable resin is used, it is preferred to use a resin that has a higher curing rate than the resin 10.

Moreover, if a resin is used for the partition member 20, the partition member 20 can be formed simultaneously with the resin 10 containing the conductive particles 11, as shown in FIG. 2A. Then, it is possible to reduce the number of steps, and it is also possible to seal even a slight gap between the first substrate 30 and the second substrate 32.

The resin used for the partition member 20 may be, for example, a sheet-like or gel-like resin composition, as well as a paste-like resin composition.

The resin of this type is preferably a thermosetting resin such as an epoxy resin, for example. Examples of the epoxy resin include, but not limited to, a bisphenol A epoxy resin, a bisphenol F epoxy resin, a biphenyl epoxy resin, a phenol novolac epoxy resin, a cresol novolac epoxy resin, a dicyclopentadiene epoxy resin, a naphthalene epoxy resin, an alicyclic epoxy resin, and the like, for example. Alternatively, a phenoxy resin, which is a high-molecular-weight epoxy resin, may be used. These resins may be used alone or in combination of two or more.

Examples of the thermoplastic resin include a polyvinyl acetal resin such as a polyvinyl butyral resin, a phenoxy resin, an acrylate resin, a methacrylate resin, a polyamide, a polyacetal, a polyphenylene sulfide, a polyimide, a polytetrafluoroethylene, a polyetheretherketone, a polyethersulfone, a urethane, a polyester, a polyethylene, a polypropylene, a polystyrene, and the like, for example.

In addition to a hardener, the resin 10 or the partition member 20 may further contain additives such as an accelerator, a polymerization inhibitor, a sensitizer, a silane coupler, a thixotropic agent, and a flame retarder. A viscosity difference may be introduced in advance between the resin 10 and the partition member 20 through a viscosity adjustment by adding an additive such as a thixotropic agent. A filler such as a silica particles or an alumina particles may be added as necessary.

The gap between the first substrate 30 and the second substrate 32 may be sealed by forming in advance another material (e.g., a solder resist or a coverlay) at a predetermined position on the surface of the first substrate 30 and/or the second substrate 32, as the partition member 20. In such a case, the height of the partition member 20 may be set so that the gap between the first electrode 31 and the second electrode 33 is equal to a predetermined height (e.g., 1 to 100 μm) when the second electrode 33 is placed facing the first electrode 31. The optimal inter-electrode height is determined based on the ratio of the inter-electrode height with respect to the gap between the first substrate 30 and the second substrate 32 and the viscosity of the resin. Alternatively, the partition member 20 may be a jig (e.g., a Teflon-lined product) machined in conformity to the outer shape of the first substrate 30 or the second substrate 32. In such a case, the partition member 20 can be removed after the step of connecting substrates together.

The first substrate 30 and the second substrate 32 may be any types of substrates as long as they have the first electrodes 31 and the second electrodes 33 on which the connectors 13 made of a conductive material can be formed. For example, the substrate may be a flexible substrate or a rigid flexible substrate, as well as a rigid substrate (e.g., an FR4 substrate). The substrate may be a circuit substrate, a single-layer circuit board, a double-layer circuit board, a multi-layer circuit board, or a device-embedded substrate in which electronic components are embedded. The substrate is not limited to a resin substrate (e.g., an FR4 substrate), but may be a ceramic substrate. In addition, it may be a semiconductor chip, and the semiconductor chip may be provided with conductive particles such as gold bumps on the electrodes thereof, or a semiconductor bare chip that is flip chip-mounted on the substrate while being mounted on an interposer having a plurality of electrode terminals (lands).

Moreover, it is only necessary that at least one of the first electrode 31 and the second electrode 33 has a protruding shape, and the other electrode may have a depressed shape or may extend flush with the substrate surface. A wiring pattern may be provided on the first electrode 31 and the second electrode 33.

Now, defoaming in the sense of removing the gas bubbles 14 includes physical defoaming and chemical defoaming. Physical defoaming includes pressure changing (e.g., depressurization), heating, frequency application, etc., and chemical defoaming includes the Marangoni effect, separation of the gas bubble substance, pH changing, dehydration, salting-out, addition of a defoaming agent, etc. In the present embodiment, a pressure difference is provided between substrates between near the partition member and on the open side so as to regulate the direction of movement of the generated gas bubbles to a certain direction and to thus make it easier to discharge the gas bubbles out of the resin, thereby achieving defoaming (removal of the gas bubbles).

The principle of the movement/discharge of the gas bubbles 14 generated in the resin 10 from near the partition member 20 toward the open side, which is a key feature of the method for mutually connecting substrates of the present invention, will now be described briefly with reference to FIGS. 4A to 4C, 5A and 5B. For the sake of simplicity, the resin 10, the conductive particles 11, the first electrodes 31 and the second electrodes 33 are not shown in the figures.

Figure 4A:
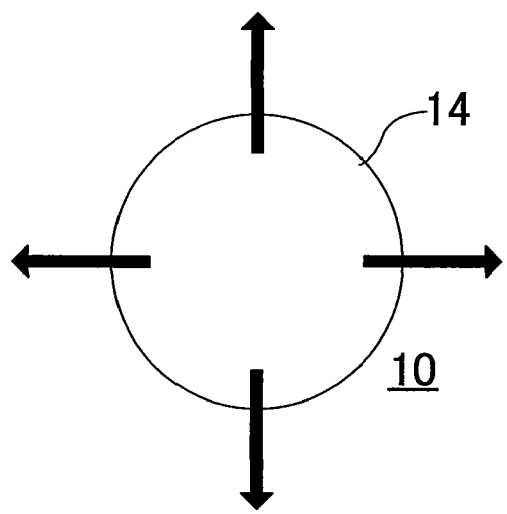
FIGS. 4A to 4C are diagrams showing the mechanism by which gas bubbles move from a partition member toward an open side according to the present invention.

FIG. 4A shows the expansion behavior of the gas bubbles 14 generated by heating where it is assumed that the resin 10 is spread infinitely. Since the area around the gas bubble 14 is open in every direction, the gas bubble 14 expands in every direction.

Figure 4B:
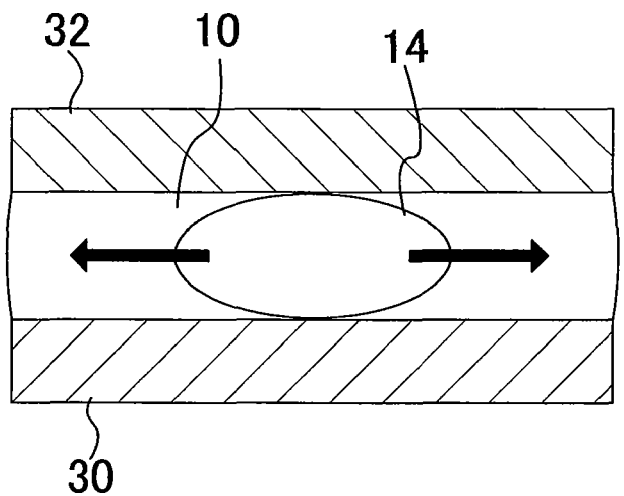

FIG. 4B is a cross-sectional view of a state where the resin 10 is sandwiched between the first substrate 30 and the second substrate 32. Since the area around the expanding gas bubble 14 is closed on the upper and lower side by the first substrate 30 and the second substrate 32, the gas bubble 14 expands in open directions as indicated by arrows in the figure.

Figure 4C:
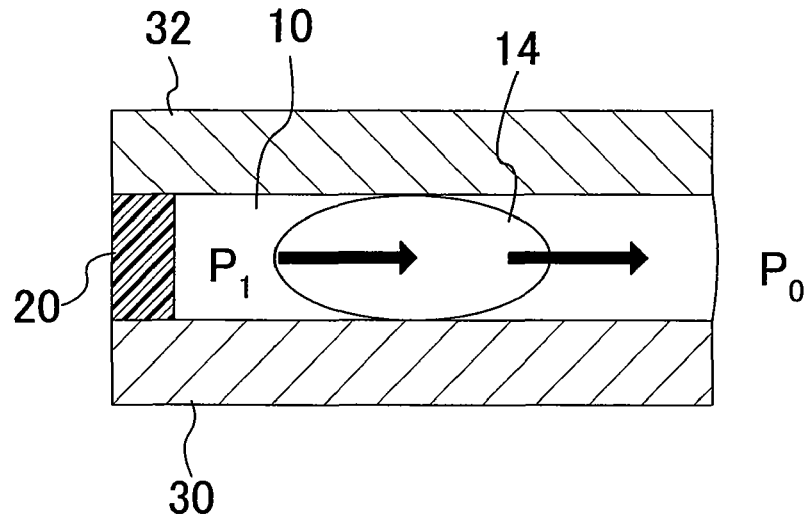

FIG. 4C is a cross-sectional view of a state where the resin 10 is sandwiched between the first substrate 30 and the second substrate 32, with the gap therebetween being sealed on one side by the partition member 20. Since the area around the expanding gas bubble 14 is closed on the upper and lower side by the first substrate 30 and the second substrate 32, with the gap therebetween being sealed on the side where the partition member 20 is formed, the pressure $P_1$ of the resin 10 in the closed space near the partition member 20 increases. This results in a difference between the pressure on the closed side and that of the open side (the atmospheric pressure) $P_0$. As a result, the gas bubble 14 expands in an open direction indicated by arrows in the figure.

Figure 5A:
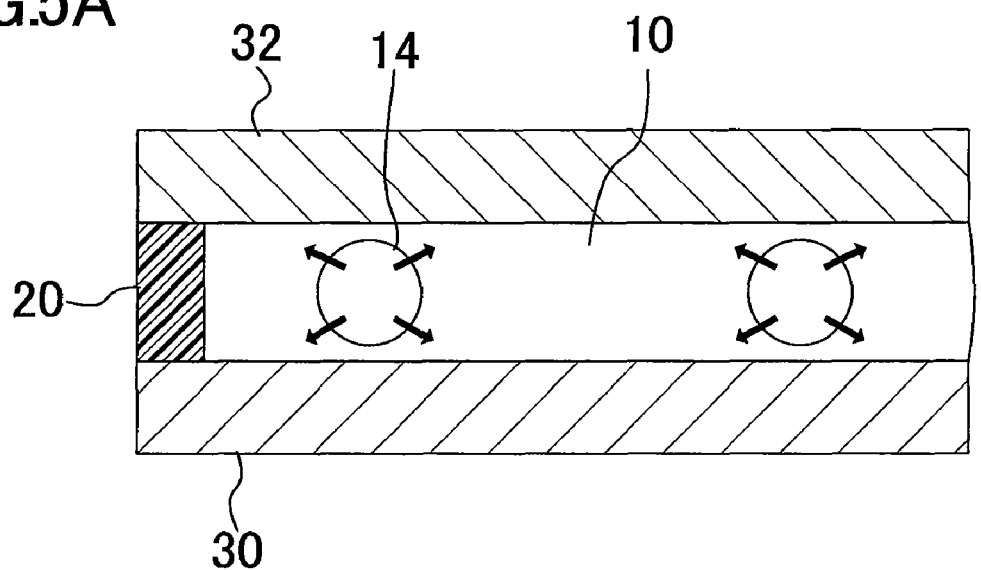
FIGS. 5A and 5B are diagrams showing the mechanism by which gas bubbles move from a partition member toward an open side according to the present invention.
Figure 5B:
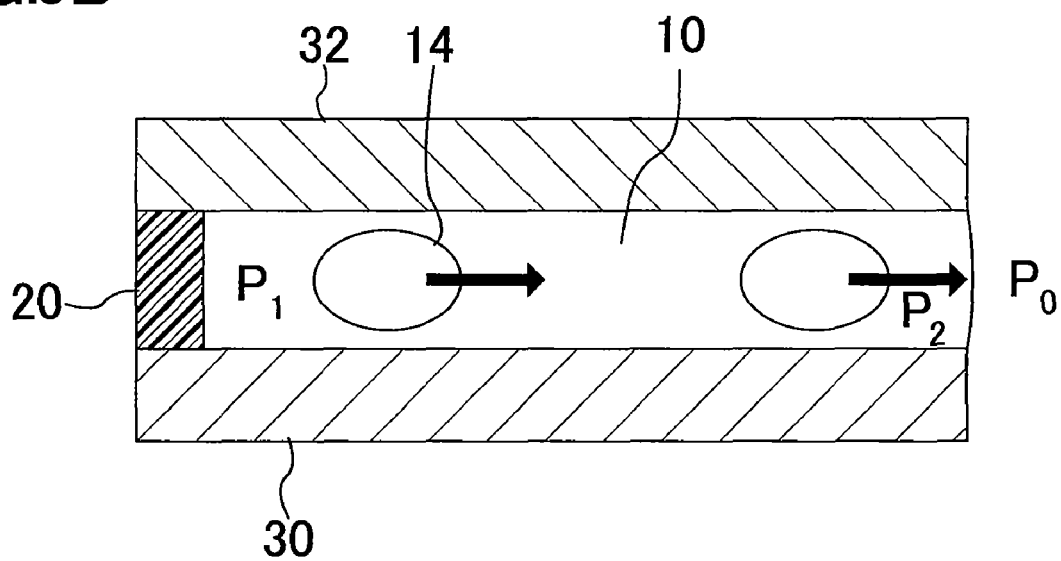

FIGS. 5A and 5B are cross-sectional views of a state where the resin 10 is sandwiched between the first substrate 30 and the second substrate 32, with the gap therebetween being sealed on one side by the partition member 20, as shown in FIG. 4C.

As shown in FIG. 5A, consider an example where the gas bubbles 14 are generated at two locations in the resin 10. The gas bubbles 14 expand in the course of time. However, in view of the gas bubble 14 expanding in the closed space near the partition member 20 and the gas bubble 14 expanding in the space on the open side, the pressure $P_1$ of the resin in the closed space near the partition member 20 is increased by the push from the expansion/growth of the gas bubbles 14, thus resulting in a difference ($P_1-P_2$) between the pressure $P_1$ near the partition member 20 and the pressure $P_2$ of the resin in the closed space on the open side. Moreover, there is also a difference ($P_2-P_0$) between the pressure $P_2$ of the resin in the closed space on the open side and the pressure on the open side (the atmospheric pressure) $P_0$. Therefore, as shown in FIG. 5B, the growing gas bubbles 14 move in the direction from the side of the higher pressure toward the side of the lower pressure, i.e., from the partition member 20 toward the open side. Moreover, as shown in FIG. 4C, the gas bubbles generated near the partition member 20 expand in the direction toward the open side, thereby pushing out gas bubbles generated on the open side.

Based on the principle described above, by providing the partition member 20 so as to seal the gap between the first substrate 30 and the second substrate 32, the generated and expanding gas bubbles 14 can be moved in the direction from the partition member 20 toward the open side. Note that in a case where the first electrode 31 and the second electrode 33 are present between the first substrate 30 and the second substrate 32, the resin 10 and the gas bubble 14 remain in such a relationship as shown in FIGS. 1A and 1B, whereby the gas bubbles 14 move only between adjacent electrodes, pushing out the resin 10 into the gap between opposing electrodes.

Next, a specific example of the present embodiment will be described.

In this example, the first substrate 30 was an FR-4 substrate, in which wiring layers to be the first electrodes 31 (in a 10×10 area array layout with a pitch of 200 µm, an electrode diameter of 100 µm, and a thickness of 18 µm) were formed in a portion of the surface-layer wiring pattern, and the second substrate 32 was a semiconductor chip (a silicon memory semiconductor with a thickness of 0.3 mm, a size of 10 mm×10 mm, and with the second electrodes 33 provided at positions corresponding to the first electrodes 31) facing the first substrate 30. The first electrodes 31 and the second electrodes 33 were electrodes plated with nickel and gold.

The partition member 20 was a one-component epoxy resin sealing the gap between the first substrate 30 and the second substrate 32 so as to surround the area where the first electrodes 31 and the second electrodes 33 are present from three directions as shown in FIG. 3.

The resin 10 contained a bisphenol A epoxy resin as a main component, and an acid anhydride as a hardener. The material of the conductive particles 11 contained solder particles SnBi, stearic acid as the oxide film remover for the solder particles, and diethylene glycol-n-hexyl ether (boiling point: 140 to 141° C.) as the gas bubble generating agent. The ratio (wt %) between the resin 10, the conductive particles 11 and the oxide film remover for solder particles was 45:50:5, and the mixing of these materials was done by stirring using a kneader.

In order to generate the gas bubbles 14 from inside the resin 10 by heating, as shown in FIG. 2C, the resin 10 was heated while the first substrate 30 was placed on a 200° C. hot plate, and the heating time was about 30 seconds (excluding the preheating time of about 10 seconds). Then, further heating was performed at 120° C. for 30 minutes to cure the resin 10.

A flip chip mounting body was manufactured by the method described above, and electrical connection between opposing electrodes was tested, indicating a good initial connection.

Variation of First Embodiment

Referring to FIGS. 6A to 6E, a variation of the first embodiment will be described. FIGS. 6A to 6E are plan views corresponding to FIG. 3, each showing a method of arrangement of the partition member 20. For the sake of simplicity, the second substrate 32, the second electrodes 33, the conductive particles 11, the connectors 13, the resin 10 on the first electrode 31, etc., are not shown in the figures.

Figure 6A:
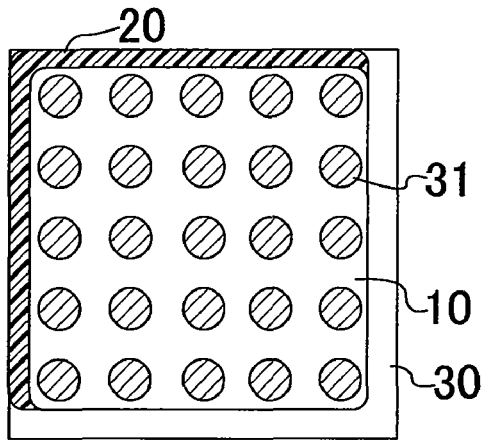
FIGS. 6A to 6E are plan views each showing a method of arrangement of a partition member according to an alternative example of the first embodiment.

The partition member 20 shown in FIG. 6A is provided so as to seal the gap between the first substrate 30 and the second substrate 32 while surrounding the area where the first electrodes 31 and the second electrodes 33 are present from at least two directions perpendicular to each other.

With such an arrangement of the partition member 20, the direction of movement of the gas bubbles 14 generated in the resin 10 can be controlled within a range of direction that is spreading away from the intersection point at which the two lines of the partition member 20 intersect at right angles. Therefore, depending on the configuration of the mounting body, the direction in which the gas bubbles 14 are discharged can be guided in any direction.

Figure 6D:
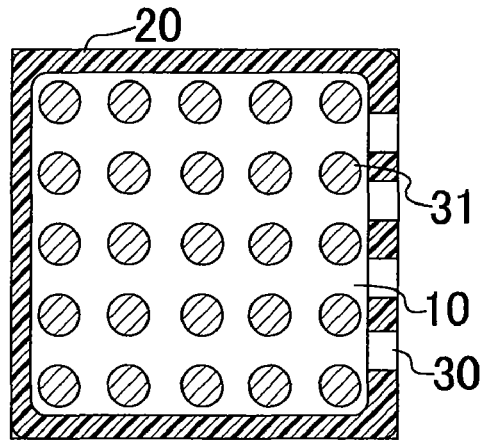
Figure 6B:
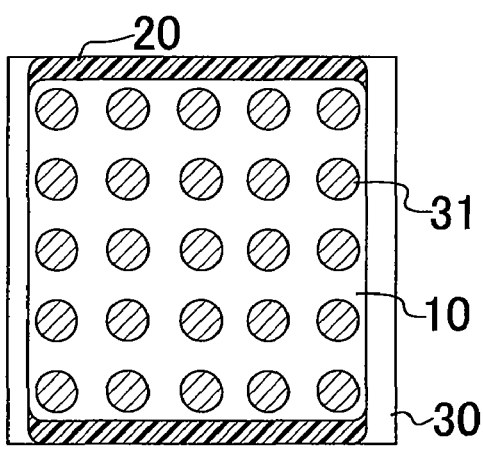

The partition member 20 shown in FIG. 6B is provided so as to seal the gap between the first substrate 30 and the second substrate 32 while surrounding the area where the first electrodes 31 and the second electrodes 33 are present from at least two directions parallel to each other.

With such an arrangement of the partition member 20, the direction of movement of the gas bubbles 14 generated in the resin 10 can be controlled in straight directions opposite to each other. Therefore, depending on the configuration of the mounting body, the direction in which the gas bubbles 14 are discharged can be guided in any direction.

Figure 6E:
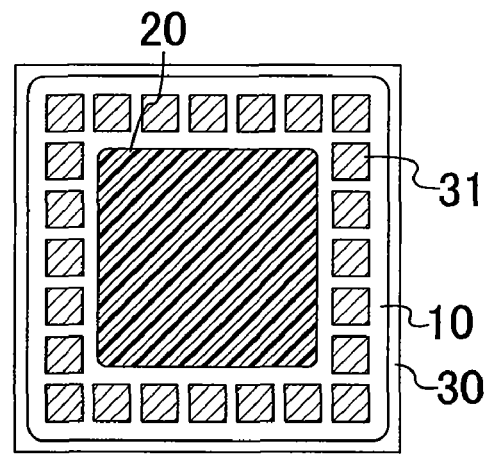
Figure 6C:
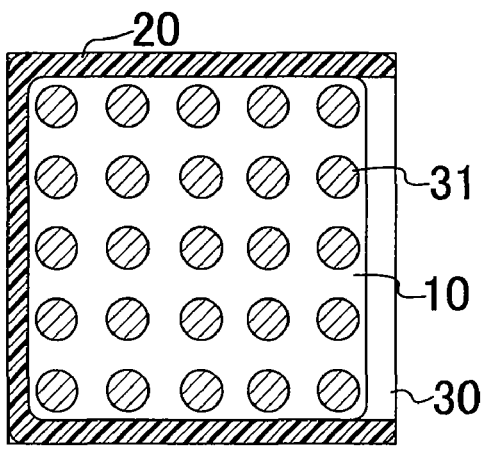

The partition members 20 shown in FIGS. 6C and 6D are each provided so as to seal the gap between the first substrate 30 and the second substrate 32 while surrounding the area where the first electrodes 31 and the second electrodes 33 are present from at least three directions. As shown in FIG. 6D, the openings can be varied as intended by the arrangement of the partition member 20, and the amount of gas bubbles to be discharged can also be controlled.

With such an arrangement of the partition member 20, the direction of movement of the gas bubbles 14 generated in the resin 10 can be converged to a single direction from the partition member 20 toward the open side, thereby forming a general flow guiding the gas bubbles 14 and controlling the direction of movement of the gas bubbles 14 generated in the resin 10. Therefore, the gas bubbles 14 generated in the resin 10 can be effectively discharged out of the area surrounded by the partition member 20, thereby removing the gas bubbles 14 that are left between the first substrate 30 and the second substrate 32.

FIG. 6E shows an arrangement of the partition member 20 in a case where the first electrodes 31 and the second substrates 32 are arranged in a peripheral pattern. In this arrangement, the partition member 20 is provided so as to fill and seal the central area between the first substrate 30 and the second substrate 32 where the first electrodes 31 and the second electrodes 33 are absent. Note that the first electrodes 31 and the second electrodes 33 may be arranged in a checkerboard pattern.

With such an arrangement of the partition member 20, the direction of movement of the gas bubbles 14 generated in the resin 10 can be controlled while forming a general flow guiding the gas bubbles 14 in a direction from the partition member 20 to the outside of the first substrate 30 or the second substrate 32 through the open side. Therefore, the gas bubbles 14 generated in the resin 10 can be effectively discharged out of the area, thereby removing the gas bubbles 14 that are left between the first substrate 30 and the second substrate 32. In a case where the central area between substrates where the first electrodes 31 and the second electrodes 33 are absent is filled with the partition member 20, it is possible to significantly reduce the residue of the conductive particles 11 and to improve the connection reliability, as compared with a case where the resin 10 containing the conductive particles 11 is applied across the entire area between substrates.

The arrangement of the partition member 20 for sealing the gap between the first substrate 30 and the second substrate 32 is not limited to the alternative examples shown in FIGS. 6A to 6E as long as there is a place that is left open for discharging the gas bubbles 14 therethrough.

Next, referring to FIGS. 7A to 7E, other alternative examples of the first embodiment will be described. Herein, FIGS. 7A to 7E are cross-sectional views each showing a step, corresponding to FIG. 2D, in a method for forming the partition member 20.

Figure 7A:
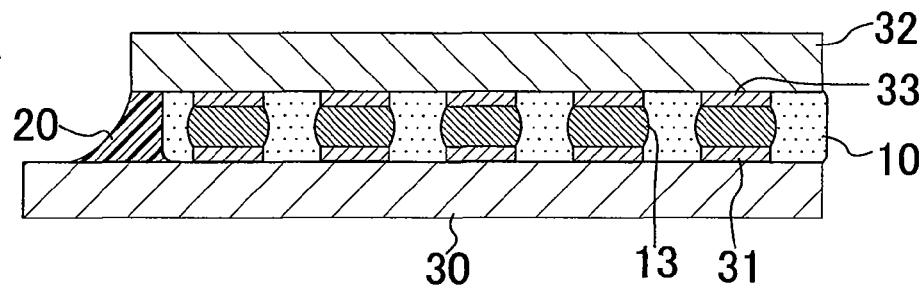
FIGS. 7A to 7E are cross-sectional views each showing a method for forming a partition member according to an alternative example of the first embodiment.

The partition member 20 shown in FIG. 7A is formed so as to be in a fillet shape at the edge surface of the second substrate 32.

Figure 7B:
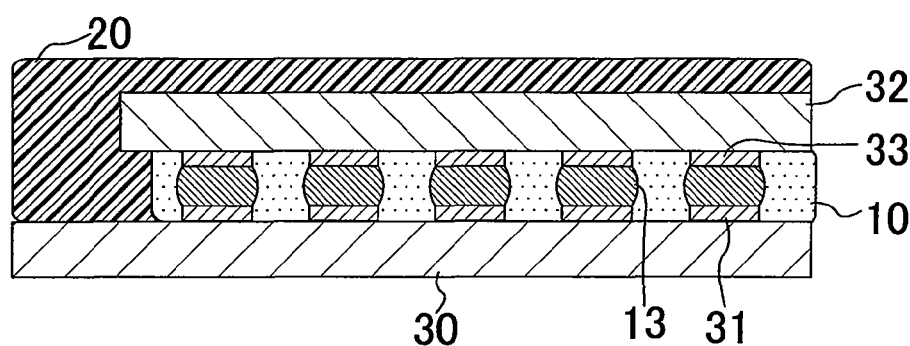

The partition member 20 shown in FIG. 7B is formed so as to cover the second substrate 32, as does a mold resin.

Figure 7C:
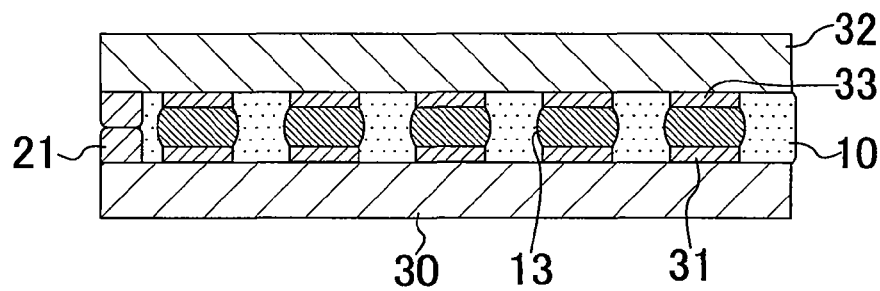

A partition member 21 shown in FIG. 7C is provided by a solder resist or a coverlay formed on the surface of the first substrate 30 and the surface of the second substrate 32.

Figure 7D:
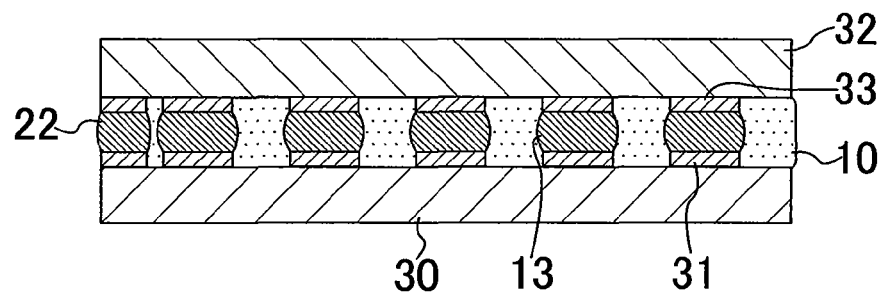

A partition member 22 shown in FIG. 7D is provided by connectors that are formed between dummy electrodes in the same manner as the connectors 13 are formed between electrodes.

Figure 7E:
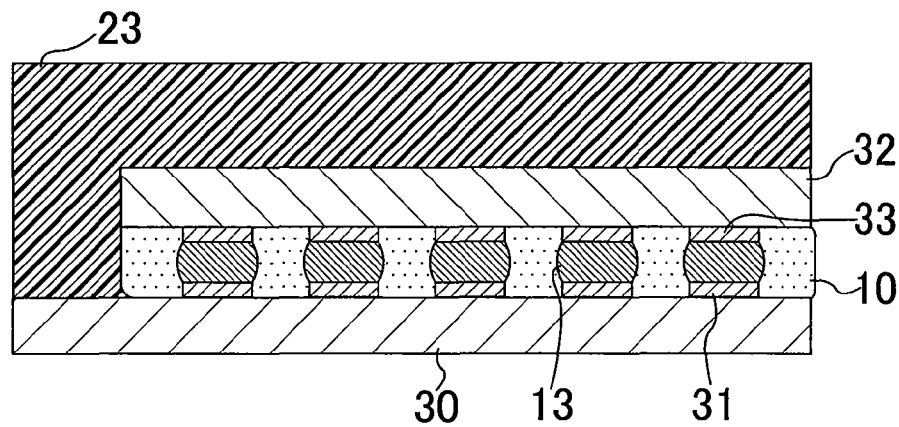

A partition member 23 shown in FIG. 7E is provided by a jig that is machined in conformity to the outer shape of the first substrate 30 or the second substrate 32 and put in place in the step of connecting substrates together. In such a case, the partition member 23 can be removed after the step of connecting substrates together.

Next, a specific example of an alternative example of the first embodiment will be described.

The first substrate 30, the second substrate 32, the resin 10, the conductive particles 11, the gas bubble generating agent, and the partition member 20 used in this example were the same as or similar to those used in the above-described example of the first embodiment. Note that the partition member 20 was provided so as to seal the gap between the first substrate 30 and the second substrate 32 while surrounding the area where the first electrodes 31 and the second electrodes 33 are present from two directions perpendicular to each other, as shown in FIG. 6A.

The heat treatment for generating the gas bubbles 14 in the resin 10, the heat treatment for melting the conductive particles 11, and the heat treatment for curing the epoxy resin were performed by employing the same conditions (the heating temperature and the heating time) as those used in the above-described example of the first embodiment.

A flip chip mounting body was manufactured by the method described above, and electrical connection between opposing electrodes was tested, indicating a good initial connection.

Second Embodiment

In the first embodiment, the first electrodes 31 and the second electrodes 33 are arranged in an array pattern or a peripheral pattern on the substrates 30 and 32, as shown in FIGS. 3 and 6A to 6E. In contrast, a second embodiment is characterized in that the first electrodes 31 and the second electrodes 33 are formed in a pattern of parallel lines.

Referring to FIGS. 8A, 8B, 9A and 9B, the method for mutually connecting substrates of the present embodiment will now be described. Note that the configuration other than the electrodes 31 and 33 and the step of connecting substrates together are basically the same as those described above in the first embodiment, and therefore will not be described in detail. Also in the present embodiment, similar functions and effects to those of the first embodiment can be achieved.

Figure 8A:
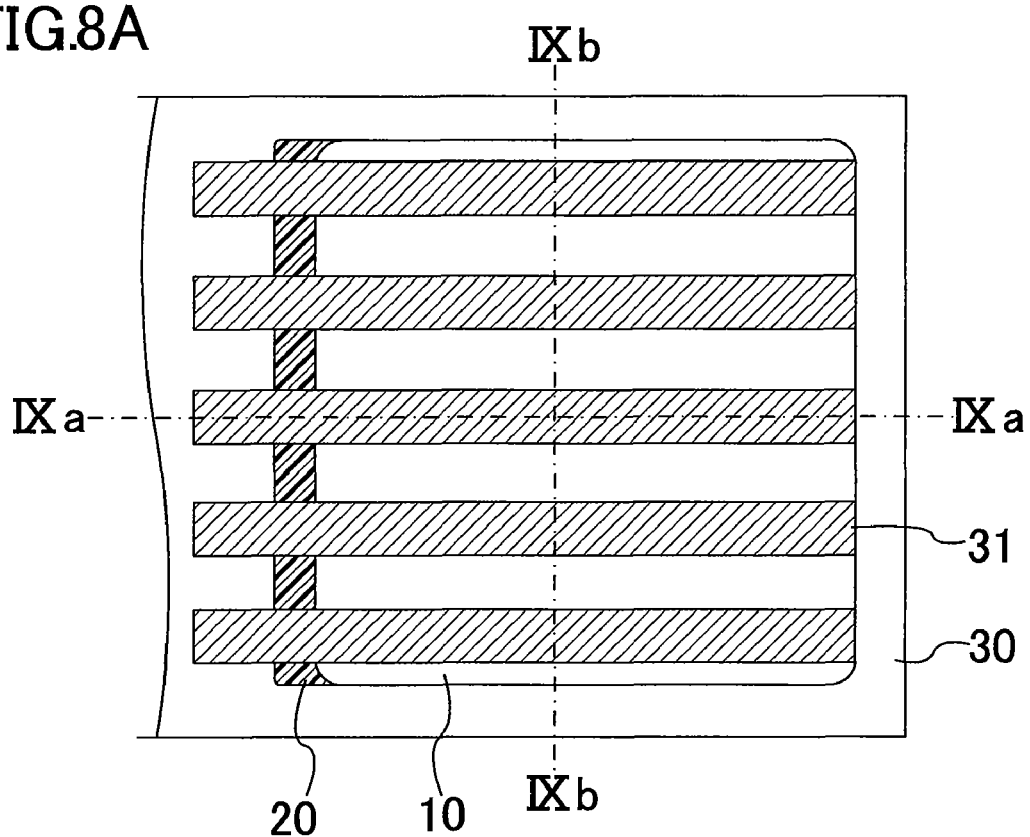
FIGS. 8A and 8B are plan views showing a method for mutually connecting substrates according to a second embodiment.
Figure 9A:
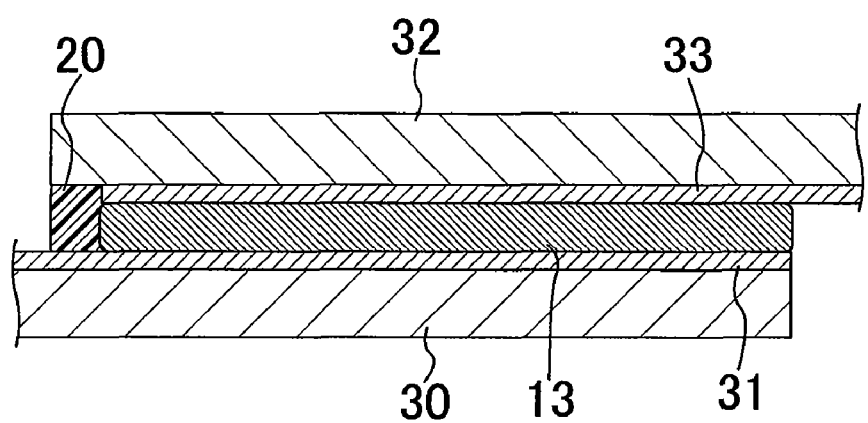
FIGS. 9A and 9B are cross-sectional views showing a method for mutually connecting substrates according to the second embodiment.
Figure 9B:
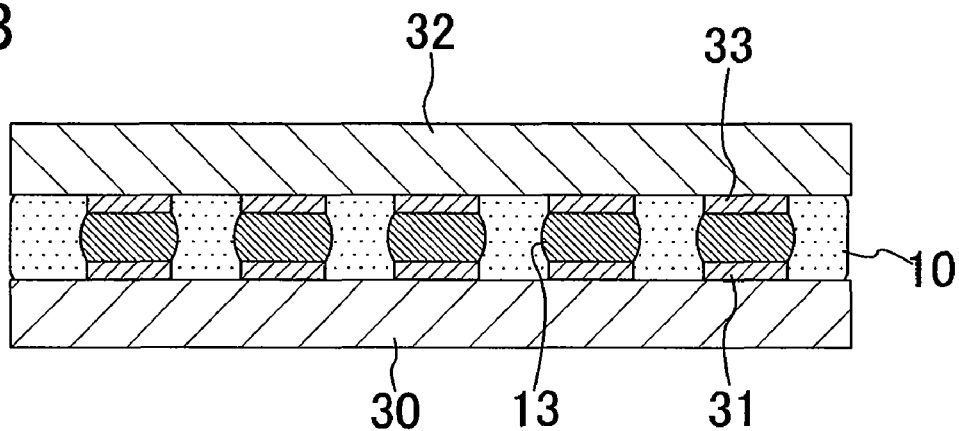

As shown in FIGS. 8A, 9A and 9B, the first electrodes 31 and the second electrodes 33 each arranged in a linear pattern are formed in parallel to one another on the first substrate 30 and the second substrate 32. The partition member 20 is provided in a direction perpendicular to the linear electrodes 31 and 33 so as to seal the gap between the first substrate 30 and the second substrate 32 while surrounding the area where the first electrodes 31 and the second electrodes 33 are present.

Figure 8B:
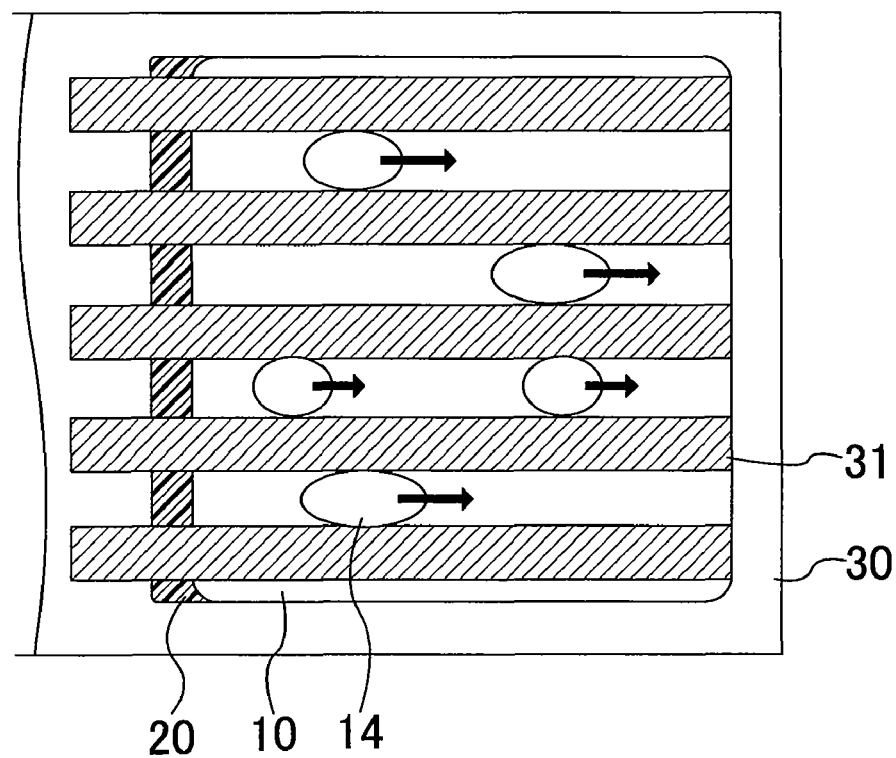

As the resin 10 is heated, the gas bubbles 14 generated in the resin 10 are discharged in a direction from the partition member 20 toward the open side, as shown in FIG. 8B. Thus, a mutual connection between substrates is made in which the first and second linear electrodes 31 and 33 are electrically connected to each other via the connectors 13 therebetween, with the gas bubbles 14 left between the first substrate 30 and the second substrate 32 having been removed, as shown in FIGS. 9A and 9B.

According to the present embodiment, as in the first embodiment, the partition member 20, which seals the gap between the substrates 30 and 32, is provided near the peripheral portion of the resin 10, whereby the gas bubbles 14 generated in the resin 10 can be effectively discharged to the outside through the peripheral portion of the resin 10 where the partition member 20 is absent, and it is thus possible to realize a reliable mutual connection between substrates with no gas bubbles left between the substrates 30 and 32.

Moreover, in the process of moving the gas bubbles 14 generated in the resin 10 toward the peripheral portion of the resin 10 that is open to the outside, the residue of conductive particles left in areas other than between electrodes is scraped off of the passageway of the gas bubbles 14 and into spaces between opposing electrodes. Thus, it is possible to reduce the residue of the conductive particles. Therefore, it is possible to realize a mutual connection between substrates having excellent insulation with no residue of conductive particles.

Next, a specific example of the present embodiment will be described.

The first substrate 30 and the second substrate 32 were flexible substrates whose base material is polyimide, in which wiring layers to be the first electrodes 31 and the second electrodes 33 (30 lines with a pitch of 200 µm, a line width of 100 µm, and a thickness of 12 µm) were formed in a portion of the surface-layer wiring pattern.

The resin 10, the conductive particles 11, the gas bubble generating agent, and the partition member 20 were the same as or similar to those used in the above-described example of the first embodiment. As shown in FIGS. 8A and 8B, the partition member 20 was arranged in a direction perpendicular to the linear electrodes 31 and 33 so as to seal the gap between the first substrate 30 and the second substrate 32 while surrounding the area where the first electrodes 31 and the second electrodes 33 are present.

The heat treatment for generating the gas bubbles 14 in the resin 10, the heat treatment for melting the conductive particles 11, and the heat treatment for curing the epoxy resin were performed by employing the same conditions (the heating temperature and the heating time) as those used in the above-described example of the first embodiment.

A mutual connection structure between substrates was manufactured by the method described above, and electrical connection between opposing electrodes (wiring layers) was tested, indicating a good initial connection.

Variation of Second Embodiment

Referring to FIGS. 10A to 10D, a variation of the second embodiment will be described. FIGS. 10A to 10D are plan views corresponding to FIG. 8A, each showing a method of arrangement of the partition member 20. For the sake of simplicity, the second substrate 32, the second electrodes 33, the conductive particles 11, the connectors 13, the resin 10 on the first electrode 31, etc., are not shown in the figures.

Figure 10A:
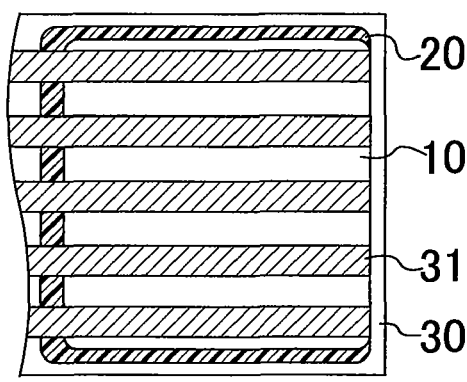
FIGS. 10A to 10D are plan views each showing a method of arrangement of a partition member according to an alternative example of the second embodiment.

The partition member 20 shown in FIG. 10A is provided so as to form a line extending in a direction perpendicular to the first and second linear electrodes 31 and 33, and two lines extending in a direction parallel to the electrodes 31 and 33 outside the outermost ones of the electrodes 31 and 33, thereby sealing the gap between the first substrate 30 and the second substrate 32 while surrounding the area where the electrodes 31 and 33 are present from three directions.

With such an arrangement of the partition member 20, since the partition member 20 extending in a direction parallel to the first and second linear electrodes 31 and 33 is present even outside the outermost ones of the first and second linear electrodes 31 and 33, it is possible to efficiently discharge to the outside the gas bubbles 14 generated outside the outermost ones of the first and second linear electrodes 31 and 33.

Figure 10B:
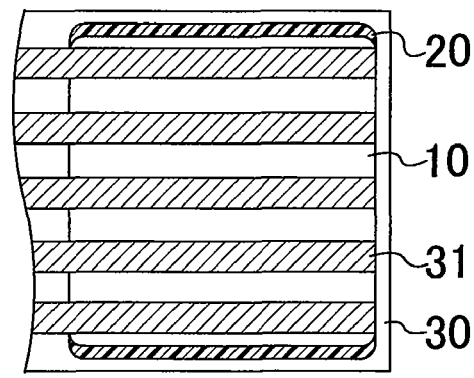

The partition member 20 shown in FIG. 10B is similar to that shown in FIG. 10A, except that the portion of the partition member 20 extending in a direction perpendicular to the first and second linear electrodes 31 and 33 is omitted. That is, the partition member 20 is provided so as to form two lines extending in a direction parallel to the first and second linear electrodes 31 and 33 outside the outermost ones of the electrodes 31 and 33, thereby sealing the gap between the first substrate 30 and the second substrate 32 while surrounding the area where the electrodes 31 and 33 are present from two directions.

With such an arrangement of the partition member 20, it is possible to efficiently discharge to the outside the gas bubbles 14 generated outside the outermost ones of the first and second linear electrodes 31 and 33.

Figure 10C:
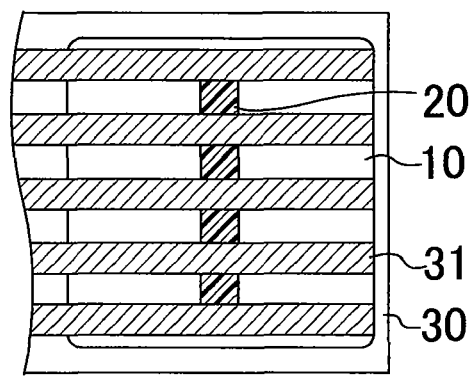

The partition member 20 shown in FIG. 10C is provided so as to extend in a direction perpendicular to the first and second linear electrodes 31 and 33 near the center of the area where the electrodes 31 and 33 are present, thereby sealing the gap between the first substrate 30 and the second substrate 32 while surrounding the area where the electrodes 31 and 33 are present from one direction.

With such an arrangement of the partition member 20, the direction of movement of the gas bubbles 14 generated in the resin 10 can be controlled, based on the position of the partition member 20, in opposite directions parallel to the linear electrodes 31 and 33 and away from the position of the partition member 20. Therefore, depending on the configuration of the mounting body, the direction in which the gas bubbles are discharged can be guided in any direction.

Figure 10D:
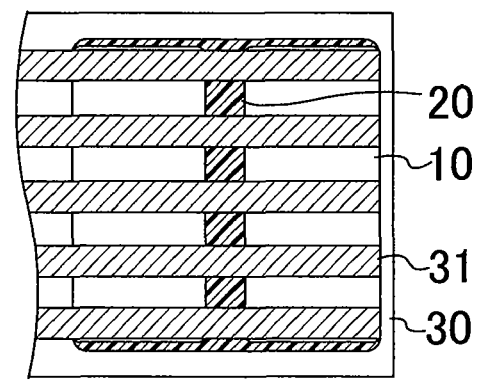
Figure 11A:
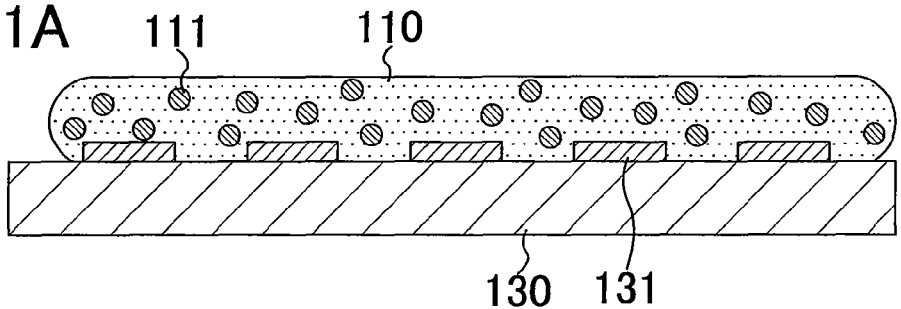
FIGS. 11A to 11D are cross-sectional views showing basic steps of a conventional flip chip mounting method.
Figure 11B:
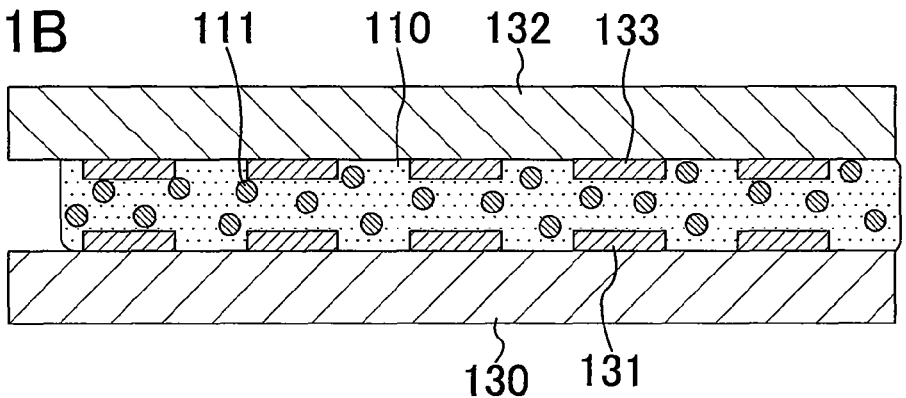
Figure 11C:
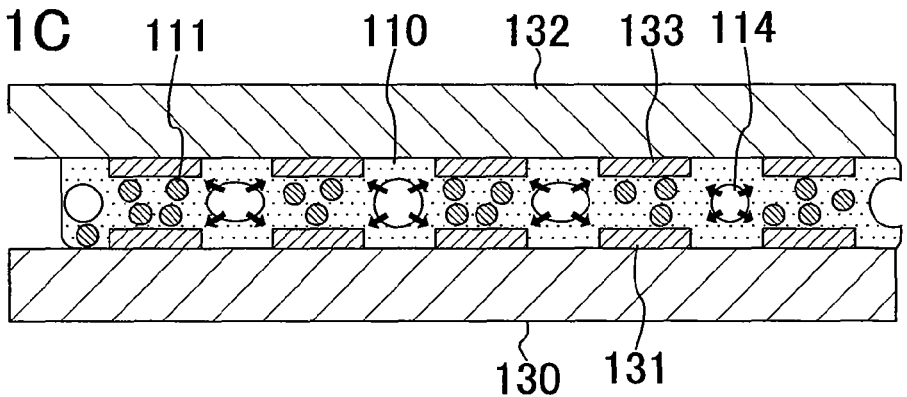
Figure 11D:
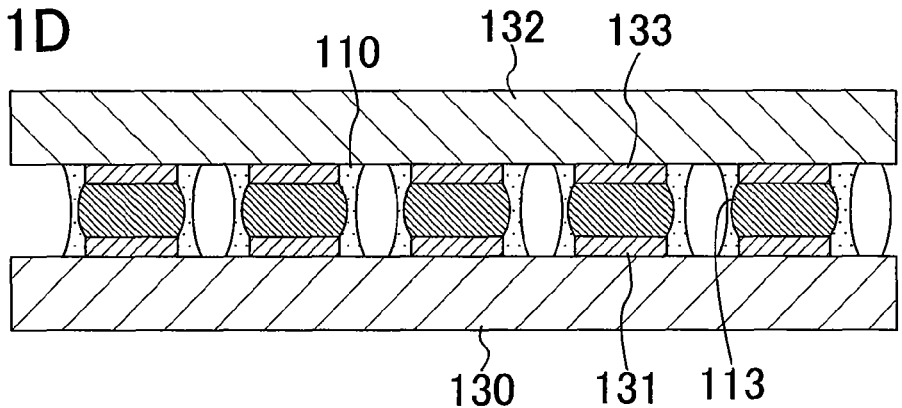

The partition member 20 shown in FIG. 10D is a combination of the partition member 20 shown in FIG. 10B with that shown in FIG. 10C. That is, the partition member 20 is provided so as to form two lines extending in a direction parallel to the first and second linear electrodes 31 and 33 outside the outermost ones of the electrodes 31 and 33 and another line extending in a direction perpendicular to the first and second linear electrodes 31 and 33 near the center of the area where the electrodes 31 and 33 are present, thereby sealing the gap between the first substrate 30 and the second substrate 32 while surrounding the area where the electrodes 31 and 33 are present from three directions.

With such an arrangement of the partition member 20, the direction of movement of the gas bubbles 14 generated in the resin 10 can be controlled, based on the position of the partition member 20, in opposite directions parallel to the linear electrodes 31 and 33 and away from the position of the partition member 20. Moreover, the partition member 20 is also provided so as to extend in a direction parallel to the linear electrodes 31 and 33 outside the outermost ones of the linear electrodes 31 and 33. Therefore, it is possible to efficiently discharge to the outside the gas bubbles 14 generated outside the outermost ones of the linear electrodes 31 and 33.

While the present invention has been described above with respect to preferred embodiments thereof, such descriptions are not limitations, and it is understood that various modifications are possible.

According to the present invention, it is possible to provide a flip chip mounting method and a method for mutually connecting substrates with high productivity and high reliability, which are applicable to flip chip mounting for next-generation LSIs.

What is claimed is:

1. A method for mutually connecting substrates, in which facing a first substrate having a plurality of first electrodes thereon, a second substrate having a plurality of second electrodes thereon is placed, and the first electrodes and the second electrodes are electrically connected to each other via connectors therebetween, the method comprising the steps of:
   (a) supplying a resin containing conductive particles and a gas bubble generating agent to an area between the first substrate and the second substrate which at least covers the plurality of first electrodes and second electrodes;
   (b) heating the resin to thereby generate gas bubbles from the gas bubble generating agent contained in the resin; and
   (c) heating the resin to thereby melt the conductive particles contained in the resin, wherein
   in the step (a), a partition member sealing a gap between the first substrate and the second substrate is provided near a peripheral portion of the resin, and a peripheral portion of the resin where the partition member is absent is open to an outside,
   in the step (b), the resin is pushed out toward an outside of the gas bubbles generated from the gas bubble generating agent by growth of the gas bubbles, thereby being guided into spaces between the first electrodes and the second electrodes, and the gas bubbles are discharged to the outside through the peripheral portion of the resin which is open to the outside, and
   in the step (c), the conductive particles contained in the resin, which have been guided into the spaces between the electrodes, are melted to thereby form the connectors between the electrodes.

2. The method for mutually connecting substrates of claim 1, wherein in the step (b), the gas bubbles generated in the resin are discharged to the outside by being guided toward the peripheral portion of the resin which is open to the outside due to a pressure difference between near the partition member and the outside.

3. The method for mutually connecting substrates of claim 1, wherein in the step (a), the partition member is provided adjacent to the peripheral portion of the resin.

4. The method for mutually connecting substrates of claim 1, wherein
   the plurality of first electrodes and the plurality of second electrodes are arranged in an array pattern on the first substrate and on the second substrate, respectively, and
   the partition member is provided along at least one side of the array-pattern electrode arrangement.

5. The method for mutually connecting substrates of claim 1, wherein
   the plurality of first electrodes and the plurality of second electrodes are arranged along a periphery of the first substrate and the second substrate, respectively, and
   the partition member is provided inside the electrode arrangement along the substrate periphery.

6. The method for mutually connecting substrates of claim 1, wherein
   the plurality of first electrodes and the plurality of second electrodes are arranged parallel to one another in a linear pattern, and the partition member is provided so as to extend in a direction perpendicular to the electrodes arranged in the linear pattern.

7. The method for mutually connecting substrates of claim 1, wherein
the plurality of first electrodes and the plurality of second electrodes are arranged parallel to one another in a linear pattern, and
the partition member is provided so as to extend in a direction parallel to the electrodes arranged in the linear pattern along a periphery of the linear-pattern electrode arrangement.

8. The method for mutually connecting substrates of claim 1, further comprising a step of removing the partition member, after the step (b) or the step (c).

9. The method for mutually connecting substrates of claim 1, wherein
at least one of the first substrate and the second substrate is provided with a gas bubble generating source for generating gas bubbles, instead of providing the gas bubble generating agent contained in the resin, and
in the step (b), the gas bubbles are generated from the gas bubble generating source.

10. The method for mutually connecting substrates of claim 1, wherein the first substrate and the second substrate are each a circuit substrate or a semiconductor chip.

11. A flip chip mounting body, comprising a circuit substrate and a semiconductor chip mounted on the circuit substrate, wherein
electrodes formed on the circuit substrate and the semiconductor chip are electrically connected to each other via connectors therebetween by the method for mutually connecting substrates of claim 1.

12. A mutual connection structure between substrates, in which circuit substrates having a plurality of electrodes thereon are electrically connected to each other, wherein
the circuit substrates are electrically connected to each other via connectors formed between the electrodes by the method for mutually connecting substrates of claim 1.

* * * * *